United States Patent [19]

Hamamura

[11] Patent Number: 5,676,789

[45] Date of Patent: Oct. 14, 1997

[54] FILM PEELING METHOD AND APPARATUS

[75] Inventor: Fumio Hamamura, Tokyo, Japan

[73] Assignee: Somar Corporation, Tokyo, Japan

[21] Appl. No.: 449,067

[22] Filed: May 24, 1995

[30] Foreign Application Priority Data

| Aug. 3, 1994 | [JP] | Japan | 6-182295 |
| Oct. 28, 1994 | [JP] | Japan | 6-264973 |

[51] Int. Cl.$^6$ ............................ B32B 31/16; B32B 31/18
[52] U.S. Cl. ............................ 156/344; 156/584
[58] Field of Search ............................ 156/344, 584, 156/234

[56] References Cited

U.S. PATENT DOCUMENTS

| 4,637,850 | 1/1987 | Suzuki et al. | 156/566 |
| 4,685,991 | 8/1987 | Herrmann et al. | |
| 4,855,012 | 8/1989 | Sumi | 156/584 |
| 4,956,044 | 9/1990 | Watanabe et al. | 156/344 |
| 5,240,546 | 8/1993 | Shiga | 156/378 |
| 5,417,922 | 5/1995 | Markin et al. | 422/104 |
| 5,427,644 | 6/1995 | Nagatsuka et al. | 156/344 |

Primary Examiner—Robert J. Warden
Assistant Examiner—E. Leigh Dawson
Attorney, Agent, or Firm—Sughrue, Mion, Zinn, Macpeak & Seas, PLLC

[57] ABSTRACT

A film peeling method for peeling a film bonded to a board, one end portion of the film overhanging from one end of the board, comprises the steps of: fixing the board by adsorbing the board in a predetermined position; clamping the one end portion of the film overhanging from the board fixed in the predetermined position by a peel hand extending in parallel with the film; causing the peel hand to make an arcuate movement with the one end portion of the film clamped, the arcuate movement being made within a plane orthogonal to the board with the vicinity of a surface of the board as the center of an arc while adjusting a position of the peel hand so as to face to the center of the arc, the peel hand moving away from the board and lifting the one end portion of the film in a direction of other end of the board during the arcuate movement; moving the lifted one end portion of the film in the direction of the other end of the board with the peel hand clamping the one end portion of the film, and further forwarding the one end portion of the film out of the board at least up to such a position as to peel other end portion of the film off the board while passing over the other end of the board; and releasing the film outside the board.

54 Claims, 6 Drawing Sheets

FILM PEELING METHOD AND APPARATUS

BACKGROUND OF THE INVENTION

1. Field of the Invention

The invention relates to a film peeling method and apparatus for peeling films bonded to printed wiring boards or the like.

2. Related Art

Printed wiring boards used for electronic devices, for instance computers, are formed by arranging predetermined wiring patterns made of copper or the like on both surfaces or a single surface of an insulating panel.

A printed wiring board of this type is prepared by the following process.

First, a laminated body comprising a photosensitive resin (photoresist) layer and a transparent resin film (protective film) for protecting the photoresist layer is laminated on a conducting layer by press sticking with a roller, the conducting layer being arranged on an insulating board. Then, after a wiring pattern film has been deposited on the thus processed laminated layer, the photoresist layer is exposed for a predetermined period of time through the wiring pattern film and the transparent resin film.

Then, after the transparent resin film has been separated, the exposed photoresist layer is developed to form an etching mask pattern, and the unnecessary part of the conductive layer is thereafter removed by etching. As a result, a printed wiring board having a predetermined wiring pattern is formed.

Proposed and implemented are film peeling apparatuses and methods that are characterized as automatically peeling the cover film in the printed wiring board preparation process.

Figure 13:
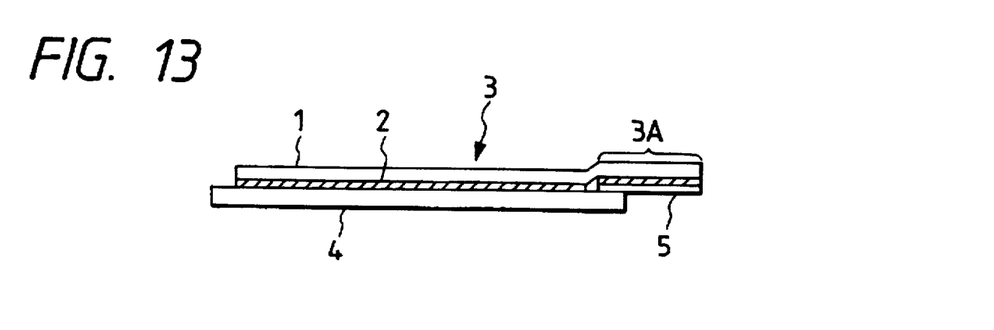
FIG. 13 is a sectional view showing a film to be peeled by the method and apparatus of the invention and a board to which the film is bonded.

One such method is disclosed, e.g., in Unexamined Japanese Patent Publication No. Hei 5-338041 (see FIG. 13). "A laminated film 3 having a photosensitive layer 2 arranged on a beltlike support body 1 is cut into a length corresponding to the length of a sheet board 4 in a sheet board supply direction. The laminated film 3 is subjected to the press sticking so as to overhang the sheet board 4. Only the photosensitive layer 2 is transferred onto the sheet board 4 by peeling the laminated film 3 at the boundary between the support body 1 and the photosensitive layer 2 after the laminated film 3 is subjected to the press sticking on the sheet board 4," and this overhanging portion 3A is clamped manually or with an apparatus to facilitate the peeling of the beltlike body 1 (film).

In this case, the blade of a cutter enters deep into the photosensitive layer 2 and an intermediate layer to cut these layers, but not as deep as to the beltlike support body 1. That is, the photosensitive layer 2 and the intermediate layer remain on the sheet board 4, and only the beltlike support body 1 is peeled off. Reference numeral 5 in FIG. 13 denotes a cover film.

In the case where a film whose end is overhanging the board is to be peeled off by an apparatus as described above, the overhanging end of the film is located at the tail end of the board in the board feeding direction. Therefore, the peeling apparatus is to be moved from the tail to the head end of the board along the board feeding line. In this case, the peeling apparatus must be located ahead of the board at least by the length of the film to peel the film off, and in addition the peeling apparatus must have such a path as not to interfere with the board in the return process thereof.

To meet these requirements, a space as large as the length of the film must be provided ahead of the board to prevent interference with devices ahead thereof, and this imposes the problem that the space in the board feeding direction is increased.

The peeling apparatus must change the path either in the upward direction or in the sideward direction in the return process, and this imposes another problem that the height and width of the whole apparatus including the board feeding device are increased.

Still further, recent improvements in the accuracy of printed wiring boards of this type makes a printed wiring board with a deposition of dust and the like even in small amounts a defect, and this imposes the problem that the movement of the film associated with the peeling of the film must be minimized.

Still further, the conventional example has taken the system of freely dropping the peeled film down onto a film receiving section below the peeling apparatus. However, this system is disadvantageous in increasing the production of dust, which thus imposes the problem that such dropping systems cannot be employed.

SUMMARY OF THE INVENTION

The invention has been made in view of the aforementioned conventional problems. Therefore, an object of the invention is to provide a film peeling method and apparatus capable of peeling a film off without interference with devices ahead and behind in the board feeding direction.

Another object of the invention is to provide a film peeling method and apparatus capable of preventing the production of dust by minimizing the movement of a film to be peeled.

Still another object of the invention is to provide a film peeling method and apparatus capable of receiving a peeled film in such a condition in which dust is hardly generated.

To achieve the above objects, according to a first aspect, the present invention provides a film peeling method for peeling a film bonded to a board, one end portion of the film overhanging from one end of the board, the method comprising the steps of: fixing the board by adsorbing the board in a predetermined position; clamping the one end of the film overhanging from the board fixed in the predetermined position by a peel hand extending in parallel with the film; causing the peel hand to make an arcuate movement with the one end portion of the film clamped, the arcuate movement being made within a plane orthogonal to the board with the vicinity of a surface of the board as the center of an arc while adjusting a position of the peel hand so as to face to the center of the arc, the peel hand moving away from the board and lifting the one end portion of the film in a direction of other end of the board during the arcuate movement; moving the lifted one end portion of the film in the direction of the other end of the board with the peel hand clamping the one end portion of the film, and further forwarding the one end portion of the film out of the board at least up to such a position as to peel other end portion of the film off the board while passing over the other end of the board; and releasing the film.

According to a second aspect, the center of the arc in the arcuate movement for lifting the one end portion of the film may be aligned with a line being in parallel with the one end of the board and passing close to the one end of the board.

According to a third aspect, the board is fed in a single direction along a feeding line with the one end portion of the film being a head end or tail end thereof. The feeding of the board may be made by stopping the board, adsorbing the board, and rotating the board by 90° within a plane parallel with the board so that the one end portion of the film is moved to a position confronting the peel hand located beside the board feeding line.

According to a fourth aspect, the film moved out of the board by the peel hand may be sequentially stacked and accommodated by pressing when released.

According to a fifth aspect, the present invention provides a film peeling apparatus for peeling a film bonded to a board, one end portion of the film overhanging from one end of the board, the apparatus comprising an adsorbing device, a peel hand and a peel hand forwarding device. The adsorbing device serves to fix the board horizontally in position by adsorbing the board. The peel hand has a pair of clamping pieces capable of being opened and closed so that the one end portion of the film overhanging from the board fixed by the adsorbing device can be clamped. The peel hand moves so as to depict almost an arc in a direction of other end of the board while moving away from a surface of the board in a peeling direction within a plane orthogonal to the board with the one end portion of the film being clamped, the pair of clamping pieces being made to face to almost the center of the arc during the arcuate movement. The peel hand forwarding device serves to horizontally forward the peel hand with the one end portion of the film clamped while passing over the other end of the board above the board up to such a position as to be distant from the other end of the board by at least a length of the board.

According to a sixth aspect, the adsorbing device includes a rotary mechanism for rotating the board within a horizontal plane with the board adsorbed; and the pair of clamping pieces of the peel hand are positioned at a height of a locus of rotation of the one end portion of the film with both pieces opened when the board is being rotated by the rotary mechanism.

According to a seventh aspect, film end supporting tables are provided, the film end supporting tables serving to position the height of the locus of rotation of the one end portion of the film within a horizontal plane by coming in contact with the one end portion of the film so as to be relatively slidable from below when the board is being rotated by the rotary mechanism, the film end supporting table coming in contact with the one end portion of the film at a position between the rotary mechanism and the peel hand.

According to a eighth aspect, the peel hand is retractable with respect to the one end portion of the film on the film end supporting tables between a film clamping position and a stand-by position; and the film end supporting tables have a clamping piece entering space as to allow the peel hand to be retractable therethrough.

According to a ninth, the peel hand includes a rotary member and the pair of clamping pieces, the rotary member horizontally rotating about a central axis of rotation running in parallel with the one end portion of the film, the pair of clamping pieces being arranged on the rotary member so as to face to the central axis of rotation.

According to a tenth aspect, the central axis of rotation may be arranged so as to pass close to the one end of the board.

According to an eleventh aspect, a stacking device is arranged in a film peeling direction with respect to the adsorbing device, the film peeling direction being a direction in which a film is peeled by the peel hand, the stacking device sequentially stacking and pressing films, each film being peeled by the peel hand and forwarded substantially horizontally.

According to a twelfth aspect, the stacking device includes a horizontal film receiving table, a first film press, a pair of second film presses, and a first drive, and a second drive. The film receiving table is located below a substantially horizontal locus of movement of the film peeled by the peel hand so as to be vertically adjustable. The first film press extends horizontally as well as in a direction orthogonal to the peeled film moving direction above the film receiving table so as to be vertically movable. The pair of second presses are located parallel as well as horizontally with the first film press above the film receiving table so as to interpose the first film press therebetween while being distant from the first film press. The first drive and the second drive vertically drive the first film press and the second film presses, respectively.

According to a thirteenth aspect, the first drive and the second drive position the first film press above the locus of movement of the film and the second film presses below the locus of movement of the film when the peeled film is being moved over the film receiving table by the peel hand, respectively, and provide a clearance between the film and the first and second film presses by causing the first film press to drop onto the film to press the film, by causing the second film presses to lift both ends of the dropped film and then get out of the film to be above the film, by causing the second film presses to then drop to press the film, and by causing the first film press to be lifted after the film has been released and dropped onto the film receiving table and the second film presses.

According to a fourteenth aspect, the board is fed by the feeding device with the overhanging end portion of the film as the head end or tail end thereof; the adsorbing device includes a turn table being located below the feeding line of the feeding device, adsorbing the board, rotating the board by 90° while lifting the board from the feeding line; and the peel hand forwarding device may include a guide and a peel hand drive, the guide being arranged so as to guide the peel hand in a direction orthogonal to the forwarding line by passing over the board, the peel hand drive causing the peel hand to shuttle along the guide.

In the method according the first aspect of the present invention, the one end portion of the film bonded to the board while overhanging from one end of the board is clamped by the peel hand, and the position of the peel hand is adjusted so as to face to the center of an arc while causing the peel hand to move arcuately. Therefore, there is no likelihood that undesired force will be applied to the one end portion of the film when the one end portion of the film is lifted by the peel hand, thereby contributing to minimizing the deformation of the film. Further, the peel hand moves and pulls the lifted end portion of the film out of the board and releases the film at a position out of the board. Therefore, if the peeled films are stacked at such position out of the board, the production of dust due to freely dropping the peeled films can be prevented.

In the method according to the second aspect, the one end portion of the film overhanging from one end of the board is lifted with the vicinity of the one end of the board as the center. Therefore, there is no likelihood that the one end portion of the film will be pulled with undesired force during the lifting operation. Hence, there is no possibility that the board will be pulled with undesired force in horizontal or vertical directions by the peel hand.

In the method according to the third aspect, the board with the film bonded thereto is rotated by 90° after the feeding of the board has been stopped, so that the board is automatically moved to confront the peel hand. Therefore, the one end portion of the film can be clamped by the peel hand with ease and certainty. In addition, by making the film peeling direction orthogonal to the board feeding direction, not only the interference of the peel hand with devices located in the board feeding direction can be avoided, but also the feeding distance can be shortened.

In the method according to the fourth aspect, the films peeled and moved out of the board by the peel hand are sequentially accommodated. Therefore, the generation of dust caused by the free dropping of the peeled films can be prevented.

In the apparatus according to the fifth aspect, the one end portion of the film that is bonded to the board so as to overhang the board is clamped, lifted without applying undesired force to the film, and fed out of the board substantially horizontally under such condition by the peel hand. Therefore, not only the film can be peeled with ease and certainty and with no danger of damaging the board, but also the possibility of generating dust from the film can be minimized at the time of peeling the film.

In the apparatus according to the sixth aspect, the absorbing device includes the rotary mechanism that can rotate the board with the board adsorbed. Therefore, the adsorbed board can be rotated by 90° with respect to the board feeding direction, which in turn facilitates the clamping of the one end portion of the film by the peel hand located in a sideward direction with respect to the board clamping line. In addition, since the direction in which the one end portion of the film is peeled by the peel hand is orthogonal to the board feeding direction, there is no likelihood that the peeling apparatus including the peel hand will interfere with the devices located in the board feeding direction. Therefore, there is no need for providing a large film forwarding distance or locating the peel hand above the forwarding device in order to prevent interference.

In the apparatus according to the seventh aspect, the one end portion of the film overhanging from the end of the board is supported by the film end supporting tables to a predetermined height, thereby facilitating the clamping pieces of the peel hand to clamp the one end portion of the film.

In the apparatus according to the eighth aspect, the one end portion of the film supported by the film end supporting tables can be clamped by the clamping pieces at the predetermined height reliably, the clamping pieces advancing toward the clamping piece entering space. At this instance, the one end portion of the film is reliably held horizontally by the film end supporting tables interposing the clamping piece entering space therebetween. Therefore, there is no possibility that the clamping pieces will operate erroneously.

In the apparatus according to the ninth aspect, the peel hand includes the rotary member and the pair of clamping pieces, the rotary member rotating about a central axis of rotation running in parallel with the one end portion of the film and the pair of clamping pieces being supported by such rotary member. Therefore, when the peel hand makes an arcuate movement within a vertical plane to peel the one end portion of the film after the one end portion of the film has been clamped by the clamping pieces, the generation of the undesired force to be applied to the film can be prevented by orienting the clamping pieces toward the center of rotation of the arcuate movement. This allows the peel hand to peel the film as if the film were peeled manually with fingers.

In the apparatus according to the tenth aspect, the central axis of rotation of the rotary member passes close to the one end of the board. Therefore, the one end portion of the film is rotated and lifted with the overhanging portion of the one end portion of the film as a base at the time of clamping and lifting the one end portion of the film with the clamping pieces supported by the rotary member, and this in turn excludes the possibility that the one end portion of the film will be pulled with respect to the board. Hence, there is no likelihood that the board will be displaced or that undesired force till be applied to the board.

In the apparatus according to the eleventh aspect, the films peeled and forwarded substantially horizontally by the peel hand are sequentially stacked and pressed by the stacking device. Therefore, the peeled film forwarding range can be minimized, which in turn contributes to minimizing the generation of dust before stacking the films.

In the apparatus according to the twelfth aspect, the first and second film presses of the stacking device are vertically driven alternately, so that the films peeled and forwarded by the peel hand can be sequentially stacked and pressed horizontally.

In the apparatus according to the thirteen aspect, a peeled film can reliably be stacked by pressing by repeating the steps of: locating the film under the second film presses by causing the second film presses that are under the film to elevate both ends of the film whose middle portion is pressed by the first film press; causing the second film presses to press the film; returning the first film press to the upper position to allow another peeled film to be introduced into a space between the first and second film presses; and causing the first press to press the introduced peeled film so that the middle portion thereof is pressed with both ends thereof covering the second film presses.

In the apparatus according to the fourteen aspect, the peel hand forwarding device is located in a direction orthogonal to the board feeding line by passing over the board. Therefore, the peel hand forwarding device is not likely to interfere with the devices located in the board feeding direction, which not only makes the film peeling apparatus space efficient, but also contributes to reducing board stop time during the peeling of a film.

DETAILED DESCRIPTION OF THE PREFERRED EMBODIMENTS

An embodiment of the invention will now be described with reference to the drawings.

Figure 1:
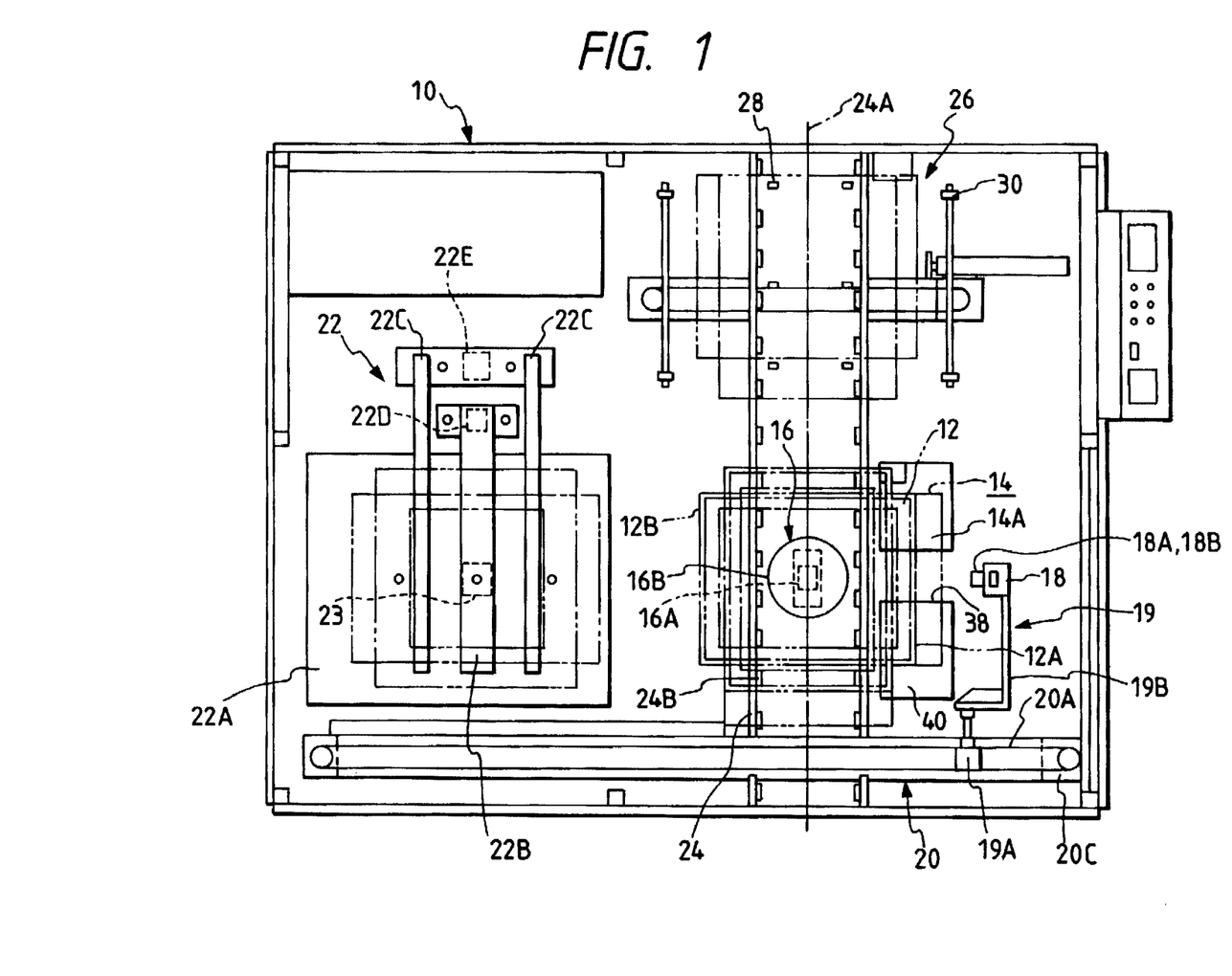
FIG. 1 is a plan view showing a film peeling apparatus, which is an embodiment of the invention.
Figure 2:
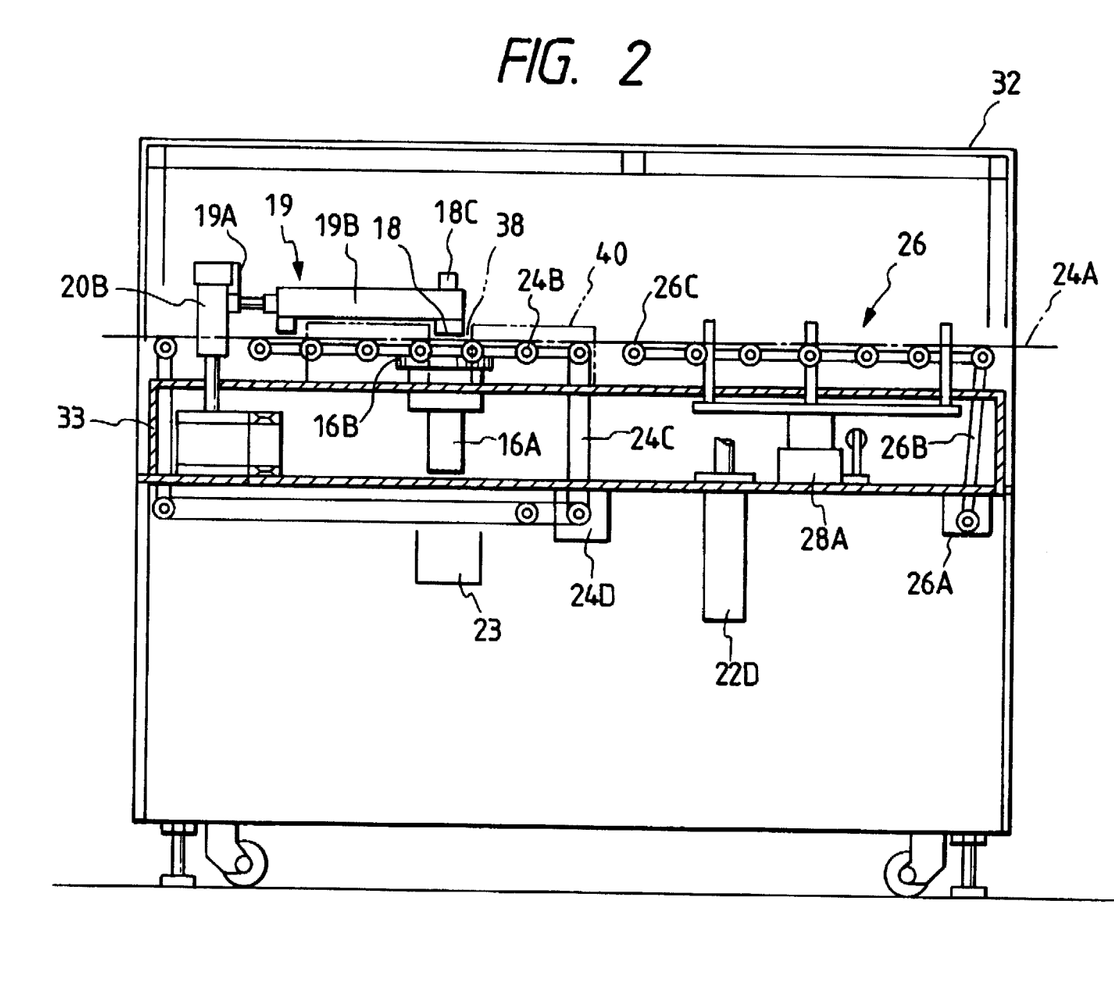
FIG. 2 is a side view of the embodiment shown in FIG. 1.

As shown in FIGS. 1 and 2, a film peeling apparatus 10, which is the embodiment of the invention, is designed to peel a film 14 whose one end portion 14A is overhanging from an end 12A of a board 12, the film 14 being bonded to the board 12. The film peeling apparatus 10 includes an adsorbing device 16, a peel hand 18, a peel hand forwarding device 20, and a stacking device 22. The adsorbing device 16 fixes the board 12 in position horizontally by adsorbing the board 12. The peel hand 18 has a pair of clamping pieces 18A and 18B that can be opened and closed so that the end portion 14A of the film overhanging from the board 12 fixed by the adsorbing device 16 can be clamped. The peel hand 18 moves so as to depict almost an arc toward the other end 12B of the board 12 while moving away from the surface of the board 12 in a peeling direction within a plane orthogonal to the board 12 with the end portion 14A clamped, and during such arcuate movement, the pair of clamping pieces 18A and 18B are made to face almost to the center of the arc. The peel hand forwarding device 20 forwards the peel hand 18 substantially horizontally to a position at which the peel hand 18 is away from the other end 12B of the board 12 by the length of the board 12 while causing the peel hand 18 to traverse the other end 12B by passing over the board 12 with the end portion 14A clamped. The stacking device 22 sequentially stacks and presses the film 14 peeled by the peel hand 18.

The board 12 is designed to be fed by a feeding device 24 along a board feeding line 24A from bottom to top as viewed in FIG. 1 and from left to right as viewed in FIG. 2.

The adsorbing device 16 has a cylinder 16A and a turn table 16B. The turn table 16B is driven vertically by the cylinder 16A, and comes in contact with the board 12 on the feeding device 24 from below, adsorbs the board 12, and rotates the board 12 within 90° over a horizontal plane. The turn table 16B has a flat top. On such top of the turn table are double circumferential grooves 34A, 34B whose diameters are different from each other, a sucking inlet 36, and eight radial grooves 34C. The sucking inlet is formed at the center of these circular grooves 34A, 34B. The radial grooves 34C extend radially from the sucking inlet 36 to the circumferential grooves 34A and 34B so as to communicate with the sucking inlet 36. The sucking inlet 36 communicates with a vacuum generating source (not shown) through a pipe (not shown) that has an opening/closing valve on the way, and selects adsorption and non-adsorption by the switching operation of the opening/closing valve. The turn table 16B stands ready at a lower position than the board feeding line 24A, and lifts the board 12 higher than the board feeding line 24A at the time the turn table 16B is elevated.

Reference character 24B in FIGS. 1 and 2 denotes a feeding roller of the feeding device 24; and 24C, a chain, installed to a sprocket wheel (not shown) of each feeding roller, for transmitting rotation from a motor 24D.

The peel hand forwarding device 20 has an endless belt 20A, a slider 20B, and a motor 20C. The endless belt 20A is arranged at an entrance end in the feeding direction so as to be orthogonal to the board feeding line 24A. The slider 20B is supported by the endless belt 20A and supports the base end of the peel hand 18. The motor 20C drives the endless belt 20A.

The stacking device 22 is arranged closely beside the feeding device 24. The endless belt 20A of the peel hand forwarding device 20 can shuttle the peel hand 18 fixed on the slider 20B from the right side of the feeding device 24 as viewed in FIG. 1 to an end of the stacking device 22 so as to pass over the feeding device 24 in a direction orthogonal to the board feeding line 24A, the end being opposite to the feeding device 24.

Figure 3:
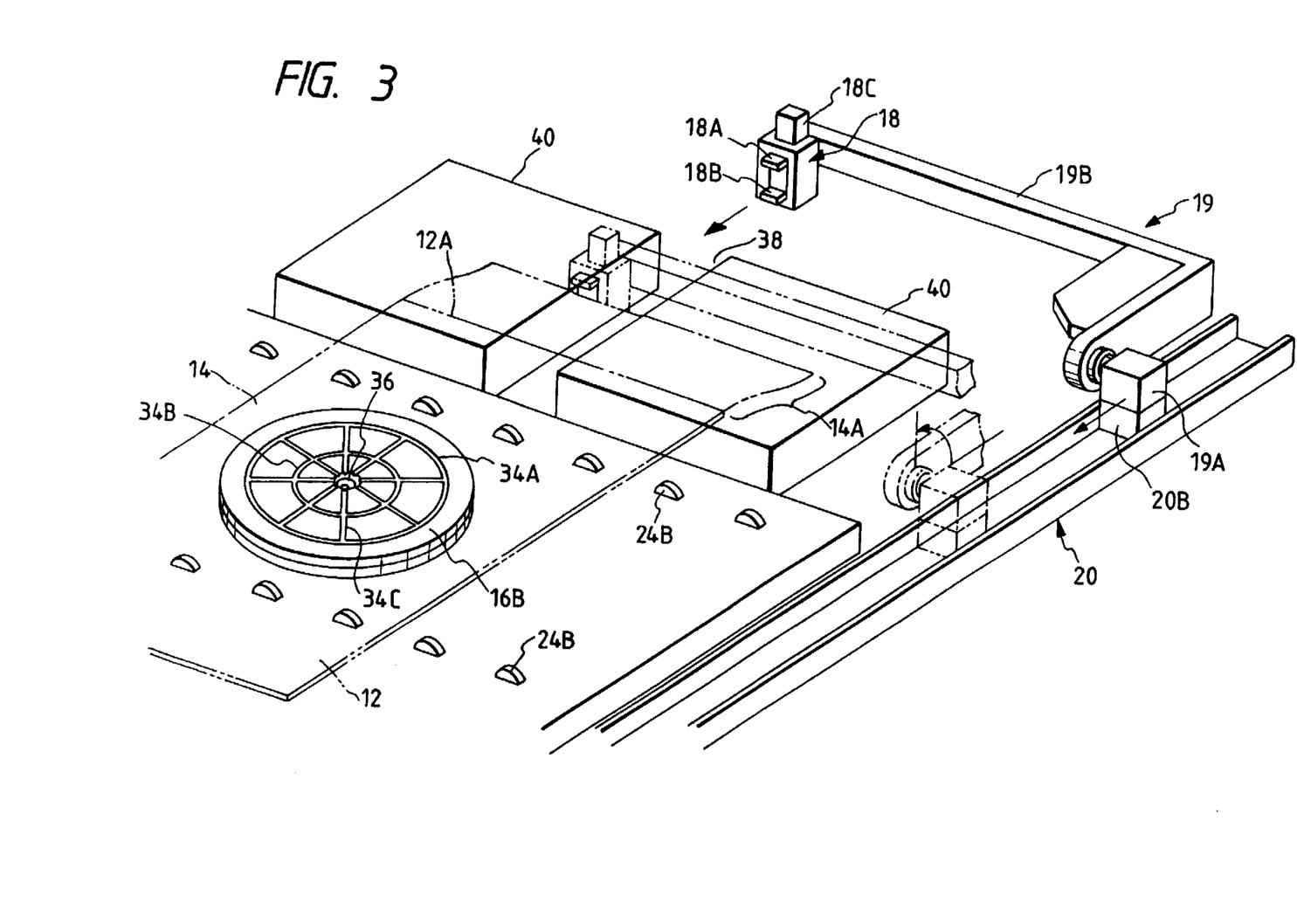
FIG. 3 is an enlarged perspective view of the main portion of the embodiment shown in FIG. 1.

As shown in FIG. 3, the peel hand device 19 including the peel hand 18 has the slider 20B, a rotary cylinder 19A, an L-shaped arm 19B, and the peel hand 18. The slider 20B is driven by the endless bent 20A of the peel hand forwarding device 20. The rotary cylinder 19A is attached to the top end of the slider 20B and causes the output shaft thereof to reciprocally oscillate within 90° about the central axis of rotation that runs in parallel with the board feeding line 24A. The L-shaped arm 19B is fixed to the output shaft of the rotary cylinder 19A. The peel hand 18 is fixed to the tip of the L-shaped arm 19B.

The peel hand 18 has a film end detecting sensor (not shown). When the clamping pieces 18A and 18B come close to the end portion 14A of the film 14 so as to clamp the end portion 14A therebetween, the peel hand 18 outputs a film end detection signal to cause an actuator 18C to close the clamping pieces 18A and 18B.

The peel hand 18 is attached to the tip of the long side of the L-shaped arm 19B, and the rotary cylinder 19A is attached to the tip of the short side of the L-shaped arm so that the output shaft thereof extends in parallel with the long side.

Therefore, the clamping pieces 18A and 18B of the peel hand 18 are arranged so as to rotate about the central axis running through the output shaft of the rotary cylinder 19A at a radius that is equal to a distance in a direction orthogonal to the central axis, the distance being between either one of the clamping pieces 18A or 18B, and the central axis.

Further, the peel hand device 19 is arranged so that the L-shaped arm 19B thereof is coplanar as shown in FIG. 3 when the peel hand device 19 is in such a stand-by position as to be distant from the end portion 14A of the film.

Close to a position of the feeding device 24 which is opposite to the stacking device 22 is a pair of film end supporting tables 40 with a clamping piece entering space 38 being interposed therebetween. The upper surface of each film end supporting table 40 is horizontal, higher than the feeding rollers 24B of the feeding device 24, and lower than the lower surface of the board 12 that is adsorbed, supported, and lifted by the turn table 16B.

Further, the clamping piece entering space 38 is designed to prevent the peel hand 18 from interfering with the film end supporting tables 40 when the peel hand 18 is moved toward the board 12 by the peel hand forwarding device 20. The clamping piece entering space 38 is also designed to help the clamping piece 18A and 18B thereof clamp the end portion 14A of the film 14 from above and from below when the end portion 14A of the film 14 overhanging from the board 12 is kept at a predetermined height by the film end supporting tables 40.

Here, the lower surface of the long side of the L-shaped arm 19B of the peel hand device 19 is arranged so as to be higher than the upper end surface of each film end supporting table 40.

Further, it is so designed that the central point between the clamping pieces 18A and 18B of the peel hand 18 which are vertically opened coincides with the upper surface of the board 12, and the lower clamping piece 18B is set to a position slightly lower than the upper surface of each film end supporting table 40 when the peel hand 18 is in a stand-by position.

Still further, the output shaft of the rotary cylinder 19A of the peel hand device 19, i.e., the central axis of rotation of the L-shaped arm 19B is designed to be on a line when the clamping pieces 18A and 18B clamp the end portion 14A of the film 14, the line passing close to the end 12A of the board 12 and being in parallel with such end 12A.

Therefore, the clamping pieces 18A and 18B confront the end portion 14A of the film as indicated by the solid line in FIG. 3 from the timing at which the clamping pieces 18A and 18B are in the stand-by position before clamping the end portion 14A of the film to the timing at which the clamping pieces clamp the end portion 14A. The clamping pieces 18A and 18B face downward with respect to the end 12A when the L-shaped arm 19B is oscillated about the central axis of rotation of the rotary cylinder 19A by the rotary cylinder 19A.

Figure 8:
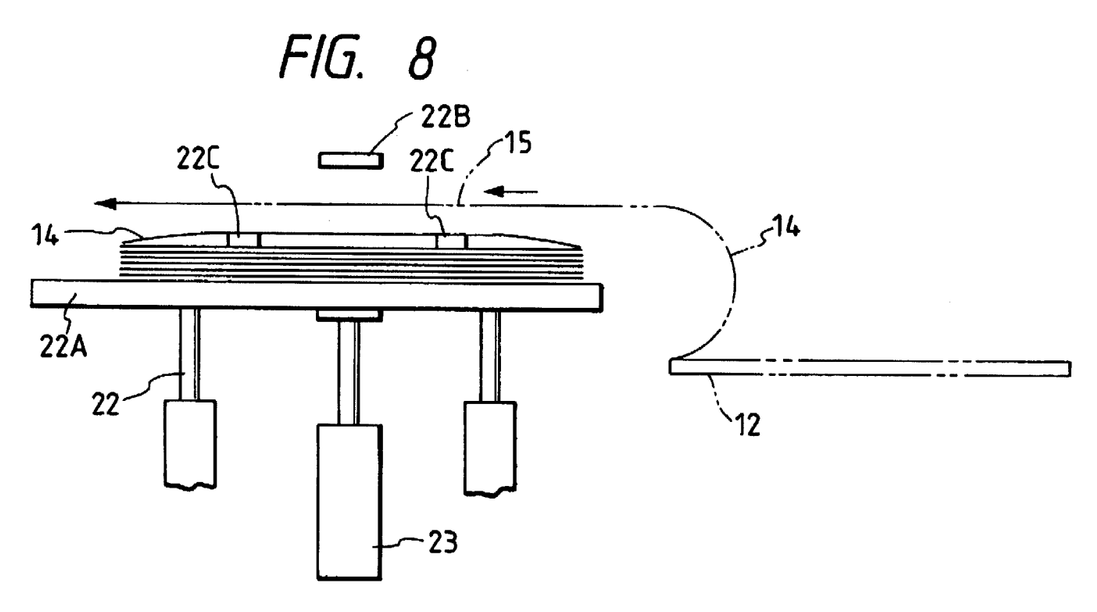
FIG. 8 is a sectional view showing the process of delivering a peeled film to a film stacking device.

As shown in FIGS. 1 and 8, the stacking device 22 has a horizontal film receiving table 22A, a first film press 22B, a pair of second film presses 22C, a first drive 22D, and a second drive 22E. The film receiving table 22A is arranged at a position lower than a horizontal movement locus 15 of a film peeled by the peel hand 18 in such a manner that the vertical position thereof can be adjusted by a motor 23. The first film press 22B, which is horizontal, extends above the film receiving table 22A in a direction orthogonal to the peeled film moving direction so as to be movable in vertical directions. The pair of second presses 22C is arranged horizontally above the film receiving table 22A so as to interpose the first film press 22B therebetween with some distance from the first film press and so as to be in parallel with the first film press 22B. The pair of second presses 22C are also movable vertically. The first and second drives 22D, 22E are constructed of air cylinders for driving the first and second film presses 22B and 22C vertically.

The first drive 22D and the second drive 22E cause the first film press 22B to move above the film moving locus 15 and the second film presses 22C below the film moving locus 15, respectively, when the peeled film 14 is moved over the film receiving table 22A by the peel hand 18. After such film 14 is dropped over the film receiving table 22A and the second film presses 22C with the end portion thereof clamped by the peel hand 18, the first film press 22B is lowered to press the film 14, and the second film presses 22C take both ends of the dropped film 14 up and move out from under the film 14 after the peel hand 18 has released the film therefrom, so that the second film presses 22C thereafter press the dropped film 14. Then, the first film press 22B is elevated to provide a gap with respect to the film 14.

Reference numeral 26 in FIGS. 1 and 2 denotes a delivery section by which the board 12 with the film 14 peeled therefrom is delivered from the feeding device 24 to a device (not shown) close to the right side as viewed in FIG. 2.

The delivery section 26 has two rows of feeding rollers 26C aligned with the feeding rollers 24B of the feeding device 24, each feeding roller 26C being driven by a motor 26A through a chain 26B.

As shown in FIG. 1, between the two rows of feeding rollers 26C on both left and right sides are a plurality of lifting free rollers 28. These lifting free rollers 28 are rotatable and arranged in a direction orthogonal to the feeding rollers 26C. These lifting free rollers 28 are moved vertically by an air cylinder 28A.

Further, on both outer sides of the two rows of feeding rollers 26C on both left and right sides is a centering device 30 that is driven by a cylinder 30A. The centering device 30 centers the board 12 lifted by the lifting free rollers 28 driven by the air cylinder 28A by pushing the board 12 from both left and right sides as viewed from the board feeding liner 24A.

Further, reference numerals 32 and 33 in FIG. 2 denote a vinyl chloride cover and a stainless cover that are provided to prevent the generation of static electricity, respectively.

The operation of the film peeling apparatus 10, which is the embodiment of the invention, will be described next.

The feeding of the board 12 with the film 14 bonded thereto, which is fed by the feeding device 24 with the end portion 14A being the tail end thereof, is stopped. At the same time, the bottom of the board 12 is adsorbed by the adsorbing device 16 with the turn table 16B of the adsorbing device 16 being lifted by the cylinder 16A. After the board 12 has been adsorbed and lifted above the feeding rollers 24B of the feeding device 24, the turn table 16B is rotated by 90° counterclockwise as viewed in FIG. 1, so that the end portion 14A of the film 14 overhanging from the end 12A of the board 12 extends in parallel with the board feeding line 24A and confronts the stacking device 22 while interposing the board feeding line 24A therebetween.

When the end portion 14A of the film 14 is rotated by 90° within a horizontal plane, the end portion 14A comes to hang over the film end supporting tables 40. At this instance, the film end supporting tables 40 keep the end portion 14A of the film 14 horizontal while supporting the end portion 14A from below, so that the end portion 14A of the film 14 is also kept horizontal at the clamping piece entering space 38 position between the film end supporting tables 40 so as to bridge the clamping piece entering space 38.

As indicated by the solid line in FIG. 3, the peel hand forwarding device 20 is operated in advance so that the peel hand 18 is set at such a position as to confront the end portion 14A of the film 14 with the L-shaped arm 19B being coplanar.

Figure 4:
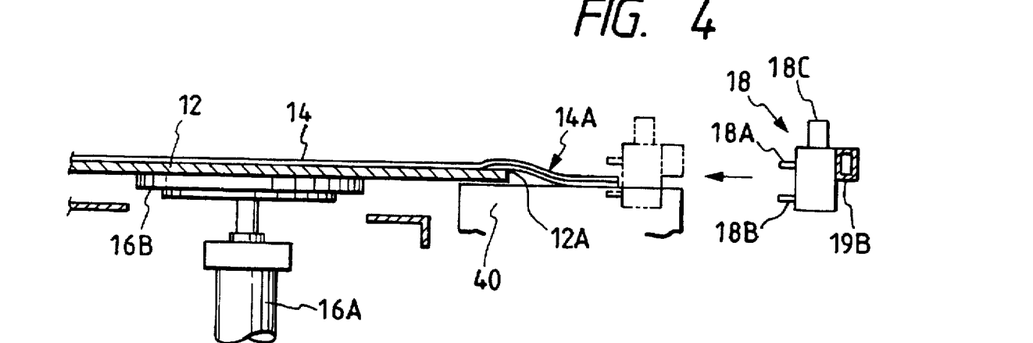
FIG. 4 is an enlarged sectional view showing the initial process of clamping an end portion of a film with a peel hand.

The peel hand 18 is operated by driving the endless belt 20A with the motor 20C of the peel hand forwarding device 20 with the clamping pieces 18A and 18B vertically opened in advance as shown in FIG. 4, so that the peel hand 18 is gradually moved toward the end portion 14A of the film 14 in the direction orthogonal to the board feeding line 24A.

The peel hand 18 enters into the feeding piece entering space 38 between the film end supporting tables 40 with the clamping pieces 18A and 18B opened vertically, and further advances toward the end portion 14A directly. The clamping pieces 18A and 18B of the peel hand 18 have a built-in film detection sensor, so that when the clamping pieces 18A and 18B come close to the end portion 14A of the film 14 and interpose such portion 14A therebetween, a signal from the film detection sensor stops the motor 20C immediately to close the clamping pieces 18A and 18B thereafter, which in turn causes the clamping pieces 18A and 18B to clamp the end portion 14A (see FIG. 5).

Figure 5:
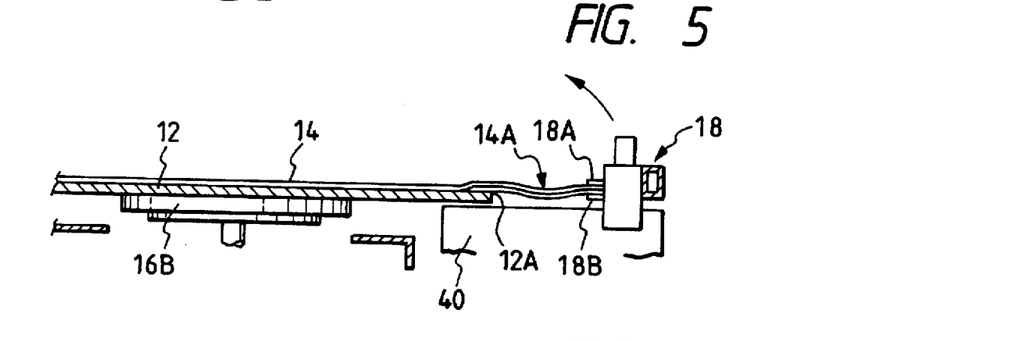
FIG. 5 is a sectional view showing the initial process of peeling the end portion of the film with the peel hand.
Figure 6:
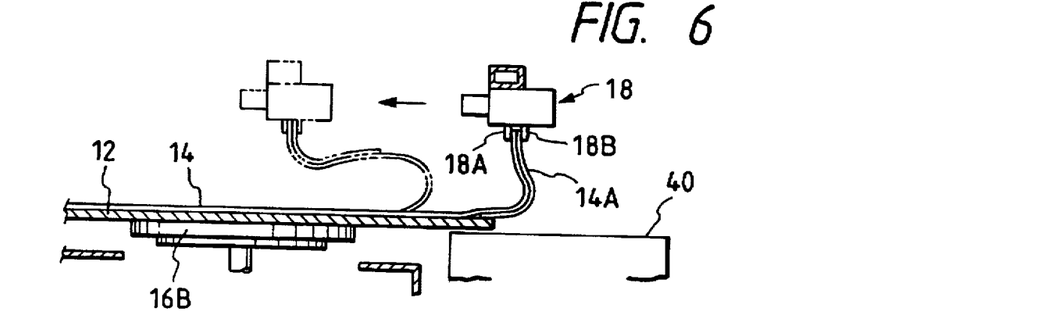
FIG. 6 a sectional view showing the intermediate process of peeling the end portion of the film with the peel hand.

Then, under this condition, the rotary cylinder 19A of the peel hand device 19 is operated to rotate the L-shaped arm 19B by 90°. As a result, the clamping pieces 18A and 18B of the peel hand 18 makes such an arcuate movement as to lift the end portion 14A of the film 14 from the board 12 as shown in FIGS. 5 and 6. Since this arcuate movement is made with the end 12A of the board 12 as the center, the clamping pieces 18A and 18B keep the position thereof facing the end 12A. That is, the clamping pieces 18A and 18B which have faced horizontal are made to face downward. Further, since the distance between the end 12A and the clamping pieces 18A, 18B remains unchanged, the end portion 14A of the film 14 is not likely to be pulled by undesired force.

Figure 7:
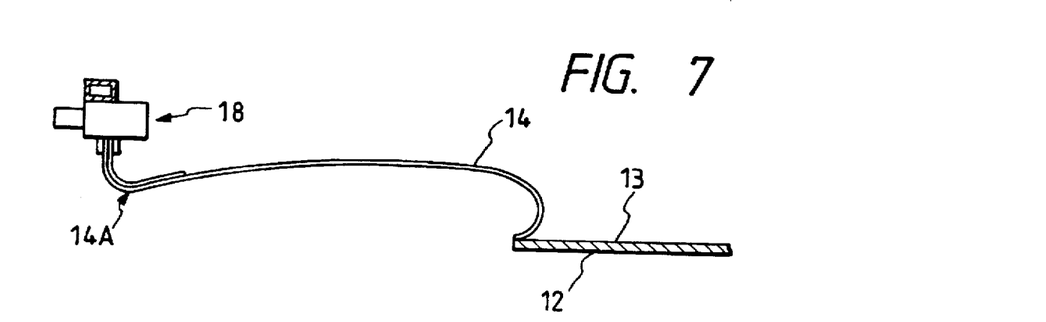
FIG. 7 is a sectional view showing the final process of peeling the end portion of the film with the peel hand.

When the peel hand 18 is moved by the peel hand forwarding device 20 to the end opposite to the stacking device 22 while passing over the board 12, the film 14 is peeled from the board 12 leaving a photosensitive layer 13 as shown in FIG. 7. Further, as shown in FIG. 8, the film 14 then enters into a space between the first film press 22B and the second film presses 22C of the stacking device 22, the presses being vertically opened.

Since not only the clamping pieces 18A and 18B always face to the center of rotation but also the radius of rotation remains unchanged during the arcuate movement, there is no likelihood that the end portion 14A of the film 14 will not be pulled out. As a result, the board 12 adsorbed by the turn table 16B of the adsorbing device 16 is not likely to be displaced due to the pulling force.

As shown in FIG. 8, the film 14 hangs over the second film presses 22C substantially horizontally under this condition, the second film presses 22C pressing the already accommodated films 14 from above.

Figure 9:
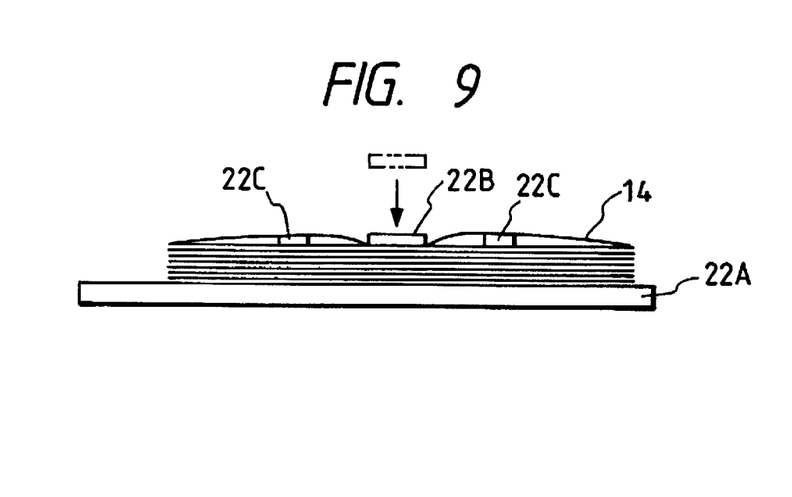
FIG. 9 is a sectional view showing the initial process of pressing the delivered peeled film.

Then, the first film press 22B is lowered as shown in FIG. 9 to fix the film 14 on the film receiving table 22A by pressing. When the film 14 has been fixed, the clamping pieces 18A and 18B that have clamped the end portion 14A of the film 14 release such end portion 14A.

Figure 10:
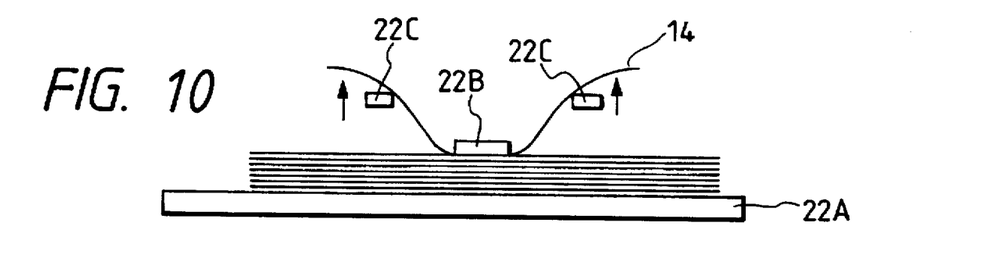
FIG. 10 is a sectional view showing the process of elevating second film presses.
Figure 11:
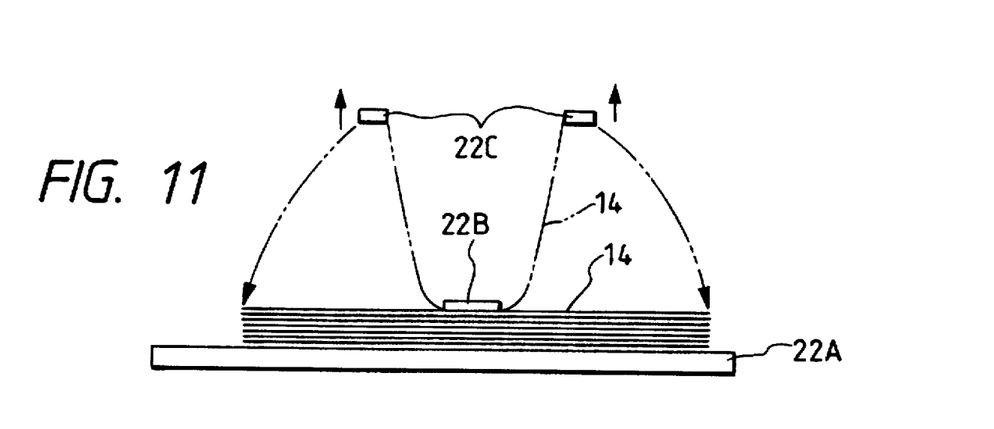
FIG. 11 is a sectional view showing the intermediate process of taking the second film presses out from below the peeled film.

Then, the second film presses 22C are elevated as shown in FIG. 10 to lift both ends of the film 14. The second film presses 22C are further elevated to slip out of both ends of the film 14 to so as to be above the film 14 as shown in FIG. 11.

At this instance, the film 14, having the middle thereof being pressed by the first film press 22B, has both ends thereof dropped onto the film receiving table 22A by resiliency and gravitational force.

Figure 12:
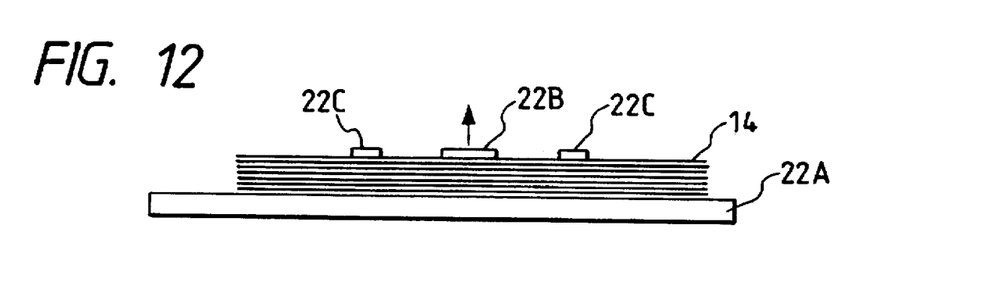
FIG. 12 is a sectional view showing the final process of pressing the peeled film.

Then, the second film presses 22C that have been elevated are lowered to press the film 14 onto the film receiving table 22A as shown in FIG. 12, and the first film press 22B in the middle is successively elevated to get ready for receiving a next film 14 as shown in FIG. 8.

In the meantime, the turn table 16B of the adsorbing device 16 returns to the original position by rotating by 90°, and lowers and releases the vacuum to thereby return the board 12 to the feeding rollers 24B of the feeding device 24. The feeding device 24 then sends the board 12 toward the delivery section 26.

On the other hand, the peel hand 18 that has released the end portion 14A of the film 14 is returned to the original position with both the first and second film presses 22B and 22C pressing the film as shown in FIG. 12, and is set so as to get ready to clamp the end portion 14A of a next film 14. Upon having received a predetermined quantity of peeled films, the film receiving table 22A is lowered by a cylinder device and provides a predetermined space to receive next films.

As described above, each of the boards 12 that are sequentially fed by the feeding device 24 has the film 14 peeled by the peel hand 18 from one side of the feeding device 24, and the peeled film is accommodated on the stacking device 22 located on the other side of the feeding device 24. Therefore, by causing the peel hand 18 to move in the direction orthogonal to the board feeding line 24A, it is no longer necessary to reserve a large space in the board feeding line 24A direction, which in turn makes it unnecessary to ensure a large height of the apparatus. Further, since the film 14 is not deformed or moved so much during the peeling operation, only a small amount of dust will be produced. Still further, since the stacking device 22 presses the peeled films 14 in laminated form, the capacity of the film accommodating section can be made small.

While the clamping pieces 18A and 18B of the peel hand 18 are made so that the position thereof is changed in association with the rotating of the L-shaped arm 19B by the rotary cylinder 19A in the aforementioned embodiment, the invention is not limited thereto. The following modification may also be acceptable. For example, the peel hand 18 is arranged so as to be oscillatable with respect to the L-shaped arm 19B, and when the L-shaped arm 19B is rotated, the peel hand 18 receives force from the film 14 through the clamping pieces 18A and 18B, so that the peel hand 18 can change the position thereof in such pulling direction.

Moreover, while the first and second film presses 22B and 22C of the stacking device 22 are driven vertically by the first and second drives 22D and 22E, respectively, these presses are not necessarily driven vertically. That is, as long as the peeled films 14 can be sequentially pressed onto the film receiving table 22A without being displaced sideways or being dropped and as long as the peel hand 18 can pass thereover, any driving mode is acceptable. Therefore, e.g., the second film presses 22C may be moved either sideways or back and forth so as to get out of the film 14 from below.

What is claimed is:

1. A film peeling method for peeling a film bonded to a board, one end portion of the film overhanging from one end of the board, said method comprising the steps of:

fixing the board by adsorbing the board in a predetermined position;

clamping the one end portion of the film overhanging from the board fixed in said predetermined position by a peel hand extending in parallel with the film;

causing said peel hand to make an arcuate movement with the one end portion of the film clamped, said arcuate movement being made within a plane orthogonal to the board, with a location proximate to a surface of the board serving as the center of an arc while adjusting a position of said peel hand so as to face to said center of said arc, said peel hand moving away from the board and lifting the one end portion of the film in a direction of another end of the board during said arcuate movement;

moving the lifted one end portion of the film in the direction of the other end of the board with said peel hand clamping the one end portion of the film, and further forwarding the one end portion of the film so as to separate the film from the board at least up to such a position as to peel the other end portion of the film off the board while passing over the other end of the board; and releasing the film outside the board.

2. A film peeling method according to claim 1, wherein said center of said arc in said arcuate movement for lifting the one end portion of the film is aligned with a line being parallel with the one end of the board and passing adjacent to the one end of the board.

3. A film peeling method according to claim 2, further comprising the steps of:

feeding the board a single direction along a feeding line with the one end portion of the film as a head end or tail end thereof;

stopping said feeding step;

adsorbing the board;

rotating the board by 90° within a plane parallel with the board after said absorbing step; and moving the one end portion of the film to a position confronting said peel hand located beside said board feeding line.

4. A film peeling method according to claim 1, further comprising the steps of:

feeding the board a single direction along a feeding line with the one end portion of the film as a head end or tail end thereof;

stopping said feeding step;

adsorbing the board;

rotating the board by 90° within a plane parallel with the board after said absorbing step; and moving the one end portion of the film to a position confronting said peel hand located beside said board feeding line.

5. A film peeling method according to claim 1, 2, 3 or 4 wherein after the film has been peeled off of the board by said peel hand, sequentially stacking and accommodating the film by pressing when the film has been released.

6. A film peeling apparatus for peeling a film bonded to a board, one end portion of the film overhanging from one end of the board, said film peeling apparatus comprising:

an adsorbing device for fixing the board horizontally in a predetermined position by adsorbing the board;

a peel hand having a pair of clamping pieces which open and close so that the one end portion of the film overhanging from the board fixed by said adsorbing device is clamped, said peel hand being mounted for rotary movement so as to move in an arc in a direction of another end of the board while moving away from a surface of the board in a peeling direction within a plane orthogonal to the board with the one end portion of the film being clamped, said pair of clamping pieces being made to face to the center of said arc during said arcuate movement; and a peel hand forwarding device for horizontally forwarding said peel hand with the one end portion of the film clamped while passing over the other end of the board above the board up to such a position as to be distant from the other end of the board by at least a length of the board.

7. A film peeling apparatus according to claim 6, wherein said adsorbing device includes a rotary mechanism for rotating the board within a horizontal plane with the board adsorbed, and wherein said pair of clamping pieces of said peel hand are positioned at a height of a locus of rotation of the one end portion of the film with both pieces opened when the board is being rotated by said rotary mechanism.

8. A film peeling apparatus according to claim 7, further comprising:

film end supporting tables provided between said rotary mechanism and said peel hand, the film end supporting tables vertically slidable, for positioning a height of the locus of rotation of the one end portion of the film within a horizontal plane by coming in contact with the one end portion of the film when the board is being rotated by said rotary mechanism.

9. A film peeling apparatus according to claim 8, wherein said peel hand includes:

a rotary member horizontally rotating about a central axis of rotation running in parallel with the one end portion of the film, said rotary member on which said pair of clamping pieces are arranged so as to face to the central axis of rotation.

10. A film peeling apparatus according to claim 9, wherein said central axis of rotation is arranged so as to pass adjacent to the one end of the board.

11. A film peeling apparatus according to claim 10, wherein a stacking device is arranged in a film peeling direction with respect to said adsorbing device, said film peeling direction being a direction in which a film is peeled by said peel hand, said stacking device sequentially stacking and pressing films, each film being peeled by said peel hand and forwarded substantially horizontally.

12. A film peeling apparatus according to claim 11, wherein said stacking device includes:

a horizontal film receiving table located below a substantially horizontal locus of movement of the film peeled by said peel hand so as to be vertically adjustable;

a first film press extending horizontally as well as in a direction orthogonal to the peeled film moving direction above said film receiving table so as to be vertically movable;

a pair of second film presses located parallel as well as horizontally with said first film press above said film receiving stable so as to interpose said first film press therebetween while being distant from said first film press;

a first drive vertically driving said first film press; and a second drive vertically driving said second film presses.

13. A film peeling apparatus according to claim 12, wherein said first drive and said second drive move said first film press and said second film presses, respectively, such that said first drive moves said first film press above said locus of movement of the film and said second drive moves said second film presses below said locus of movement of the film when the peeled film is being moved over said film receiving table by said peel hand, said first drive drives said first film press to drop onto the film to press the film after the film has been released and dropped onto said film receiving table, said second drive drives said second film presses to lift both ends of the dropped film and then get out of the film to be above the film, said second drive drives said second film presses to then drop onto the film to press the film, and said first drive moves upwardly said first film press so as to have a clearance between the film and said first film press.

14. A film peeling apparatus according to claim 9, wherein a stacking device is arranged in a film peeling direction with respect to said adsorbing device, said film peeling direction being a direction in which a film is peeled by said peel hand, said stacking device sequentially stacking and pressing films, each film being peeled by said peel hand and forwarded substantially horizontally.

15. A film peeling apparatus according to claim 14, wherein said stacking device includes:

a horizontal film receiving table located below a substantially horizontal locus of movement of the film peeled by said peel hand so as to be vertically adjustable;

a first film press extending horizontally as well as in a direction orthogonal to the peeled film moving direction above said film receiving table so as to be vertically movable;

a pair of second film presses located parallel as well as horizontally with said first film press above said film receiving table so as to interpose said first film press therebetween while being distant from said first film press;

a first drive vertically driving said first film press; and a second drive vertically driving said second film presses.

16. A film peeling apparatus according to claim 15, wherein said first drive and said second drive move said first film press and said second film presses, respectively, such that said first drive moves said first film press above said locus of movement of the film and said second drive moves said second film presses below said locus of movement of the film when the peeled film is being moved over said film receiving table by said peel hand, said first drive drives said first film press to drop onto the film to press the film after the film has been released and dropped onto said film receiving table, said second drive drives said second film presses to lift both ends of the dropped film and then get out of the film to be above the film, said second drive drives said second film presses to then drop onto the film to press the film, and said first drive moves upwardly said first film press so as to have a clearance between the film and said first film press.

17. A film peeling apparatus according to claim 8, wherein a stacking device is arranged in a film peeling direction with respect to said adsorbing device, said film peeling direction being a direction in which a film is peeled by said peel hand, said stacking device sequentially stacking and pressing films, each film being peeled by said peel hand and forwarded substantially horizontally.

18. A film peeling apparatus according to claim 17, wherein said stacking device includes:

a horizontal film receiving table located below a substantially horizontal locus of movement of the film peeled by said peel hand so as to be vertically adjustable;

a first film press extending horizontally as well as in a direction orthogonal to the peeled film moving direction above said film receiving table so as to be vertically movable;

a pair of second film presses located parallel as well as horizontally with said first film press above said film receiving table so as to interpose said first film press therebetween while being distant from said first film press;

a first drive vertically driving said first film press; and a second drive vertically driving said second film presses.

19. A film peeling apparatus according to claim 18, wherein said first drive and said second drive move said first film press and said second film presses, respectively, such that said first drive moves said first film press above said locus of movement of the film and said second drive moves said second film presses below said locus of movement of the film when the peeled film is being moved over said film receiving table by said peel hand, said first drive drives said first film press to drop onto the film to press the film after the film has been released and dropped onto said film receiving table, said second drive drives said second film presses to lift both ends of the dropped film and then get out of the film to be above the film, said second drive drives said second film presses to then drop onto the film to press the film, and said first drive moves upwardly said first film press so as to have a clearance between the film and said first film press.

20. A film peeling apparatus according to claim 8, wherein said peel hand is retractable with respect to the one end portion of the film on said film end supporting tables between a film clamping position and a stand-by position, and wherein said film end supporting tables have a clamping piece entering space for allowing said peel hand to be retractable therethrough.

21. A film peeling apparatus according to claim 20, wherein said peel hand includes:

a rotary member horizontally rotating about a central axis of rotation running in parallel with the one end portion of the film, said rotary member on which said pair of clamping pieces are arranged so as to face to the central axis of rotation.

22. A film peeling apparatus according to claim 21, wherein a stacking device is arranged in a film peeling direction with respect to said adsorbing device, said film peeling direction being a direction in which a film is peeled by said peel hand, said stacking device sequentially stacking and pressing films, each film being peeled by said peel hand and forwarded substantially horizontally.

23. A film peeling apparatus according to claim 22, wherein said stacking device includes:

a horizontal film receiving table located below a substantially horizontal locus of movement of the film peeled by said peel hand so as to be vertically adjustable;

a first film press extending horizontally as well as in a direction orthogonal to the peeled film moving direction above said film receiving table so as to be vertically movable;

a pair of second film presses located parallel as well as horizontally with said first film press above said film receiving table so as to interpose said first film press therebetween while being distant from said first film press;

a first drive vertically driving said first film press; and a second drive vertically driving said second film presses.

24. A film peeling apparatus according to claim 23, wherein said first drive and said second drive move said first film press and said second film presses, respectively, such that said first drive moves said first film press above said locus of movement of the film and said second drive moves said second film presses below said locus of movement of the film when the peeled film is being moved over said film receiving table by said peel hand, said first drive drives said first film press to drop onto the film to press the film after the film has been released and dropped onto said film receiving table, said second drive drives said second film presses to lift both ends of the dropped film and then get out of the film to be above the film, said second drive drives said second film presses to then drop onto the film to press the film, and said first drive moves upwardly said first film press so as to have a clearance between the film and said first film press.

25. A film peeling apparatus according to claim 21, wherein said central axis of rotation is arranged so as to pass adjacent to the one end of the board.

26. A film peeling apparatus according to claim 25, wherein a stacking device is arranged in a film peeling direction with respect to said adsorbing device, said film peeling direction being a direction in which a film is peeled by said peel hand, said stacking device sequentially stacking and pressing films, each film being peeled by said peel hand and forwarded substantially horizontally.

27. A film peeling apparatus according to claim 26, wherein said stacking device includes:

a horizontal film receiving table located below a substantially horizontal locus of movement of the film peeled by said peel hand so as to be vertically adjustable;

a first film press extending horizontally as well as in a direction orthogonal to the peeled film moving direction above said film receiving table so as to be vertically movable;

a pair of second film presses located parallel as well as horizontally with said first film press above said film receiving table so as to interpose said first film press therebetween while being distant from said first film press;

a first drive vertically driving said first film press; and a second drive vertically driving said second film presses.

28. A film peeling apparatus according to claim 27, wherein said first drive and said second drive move said first film press and said second film presses, respectively, such that said first drive moves said first film press above said locus of movement of the film and said second drive moves said second film presses below said locus of movement of the film when the peeled film is being moved over said film receiving table by said peel hand, said first drive drives said first film press to drop onto the film to press the film after the film has been released and dropped onto said film receiving table, said second drive drives said second film presses to lift both ends of the dropped film and then get out of the film to be above the film, said second drive drives said second film presses to then drop onto the film to press the film, and said first drive moves upwardly said first film press so as to have a clearance between the film and said first film press.

29. A film peeling apparatus according to claim 20, wherein a stacking device is arranged in a film peeling direction with respect to said adsorbing device, said film peeling direction being a direction in which a film is peeled by said peel hand, said stacking device sequentially stacking and pressing films, each film being peeled by said peel hand and forwarded substantially horizontally.

30. A film peeling apparatus according to claim 29, wherein said stacking device includes:

a horizontal film receiving table located below a substantially horizontal locus of movement of the film peeled by said peel hand so as to be vertically adjustable;

a first film press extending horizontally as well as in a direction orthogonal to the peeled film moving direction above said film receiving table so as to be vertically movable;

a pair of second film presses located parallel as well as horizontally with said first film press above said film receiving table so as to interpose said first film press therebetween while being distant from said first film press;

a first drive vertically driving said first film press; and a second drive vertically driving said second film presses.

31. A film peeling apparatus according to claim 30, wherein said first drive and said second drive move said first film press and said second film presses, respectively, such that said first drive moves said first film press above said locus of movement of the film and said second drive moves said second film presses below said locus of movement of the film when the peeled film is being moved over said film receiving table by said peel hand, said first drive drives said first film press to drop onto the film to press the film after the film has been released and dropped onto said film receiving table, said second drive drives said second film presses to lift both ends of the dropped film and then get out of the film to be above the film, said second drive drives said second film presses to then drop onto the film to press the film, and said first drive moves upwardly said first film press so as to have a clearance between the film and said first film press.

32. A film peeling apparatus according to claim 7, wherein said peel hand includes:

a rotary member horizontally rotating about a central axis of rotation running in parallel with the one end portion of the film, said rotary member on which said pair of clamping pieces are arranged so as to face to the central axis of rotation.

33. A film peeling apparatus according to claim 32, wherein said central axis of rotation is arranged so as to pass adjacent to the one end of the board.

34. A film peeling apparatus according to claim 33, wherein a stacking device is arranged in a film peeling direction with respect to said adsorbing device, said film peeling direction being a direction in which a film is peeled by said peel hand, said stacking device sequentially stacking and pressing films, each film being peeled by said peel hand and forwarded substantially horizontally.

35. A film peeling apparatus according to claim 34, wherein said stacking device includes:

a horizontal film receiving table located below a substantially horizontal locus of movement of the film peeled by said peel hand so as to be vertically adjustable;

a first film press extending horizontally as well as in a direction orthogonal to the peeled film moving direction above said film receiving table so as to be vertically movable;

a pair of second film presses located parallel as well as horizontally with said first film press above said film receiving table so as to interpose said first film press therebetween while being distant from said first film press;

a first drive vertically driving said first film press; and a second drive vertically driving said second film presses.

36. A film peeling apparatus according to claim 35, wherein said first drive and said second drive move said first film press and Said second film presses, respectively, such that said first drive moves said first film press above said locus of movement of the film and said second drive moves said second film presses below said locus of movement of the film when the peeled film is being moved over said film receiving table by said peel hand, said first drive drives said first film press to drop onto the film to press the film after the film has been released and dropped onto said film receiving table, said second drive drives said second film presses to lift both ends of the dropped film and then get out of the film to be above the film, said second drive drives said second film presses to then drop onto the film to press the film, and said first drive moves upwardly said first film press so as to have a clearance between the film and said first film press.

37. A film peeling apparatus according to claim 32, wherein a stacking device is arranged in a film peeling direction with respect to said adsorbing device, said film peeling direction being a direction in which a film is peeled by said peel hand, said stacking device sequentially stacking and pressing films, each film being peeled by said peel hand and forwarded substantially horizontally.

38. A film peeling apparatus according to claim 37, wherein said stacking device includes:

a horizontal film receiving table located below a substantially horizontal locus of movement of the film peeled by said peel hand so as to be vertically adjustable;

a first film press extending horizontally as well as in a direction orthogonal to the peeled film moving direction above said film receiving table so as to be vertically movable;

a pair of second film presses located parallel as well as horizontally with said first film press above said film receiving table so as to interpose said first film press therebetween while being distant from said first film press;

a first drive vertically driving said first film press; and a second drive vertically driving said second film presses.

39. A film peeling apparatus according to claim 38, wherein said first drive and said second drive move said first film press and said second film presses, respectively, such that said first drive moves said first film press above said locus of movement of the film and said second drive moves said second film presses below said locus of movement of the film when the peeled film is being moved over said film receiving table by said peel hand, said first drive drives said first film press to drop onto the film to press the film after the film has been released and dropped onto said film receiving table, said second drive drives said second film presses to lift both ends of the dropped film and then get out of the film to be above the film, said second drive drives said second film presses to then drop onto the film to press the film, and said first drive moves upwardly said first film press so as to have a clearance between the film and said first film press.

40. A film peeling apparatus according to claim 7, wherein a stacking device is arranged in a film peeling direction with respect to said adsorbing device, said film peeling direction being a direction in which a film is peeled by said peel hand, said stacking device sequentially stacking and pressing films, each film being peeled by said peel hand and forwarded substantially horizontally.

41. A film peeling apparatus according to claim 40, wherein said stacking device includes:
- a horizontal film receiving table located below a substantially horizontal locus of movement of the film peeled by said peel hand so as to be vertically adjustable;
- a first film press extending horizontally as well as in a direction orthogonal to the peeled film moving direction above said film receiving table so as to be vertically movable;
- a pair of second film presses located parallel as well as horizontally with said first film press above said film receiving table so as to interpose said first film press therebetween while being distant from said first film press;
- a first drive vertically driving said first film press; and
- a second drive vertically driving said second film presses.

42. A film peeling apparatus according to claim 41, wherein said first drive and said second drive move said first film press and said second film presses, respectively, such that said first drive moves said first film press above said locus of movement of the film and said second drive moves said second film presses below said locus of movement of the film when the peeled film is being moved over said film receiving table by said peel hand, said first drive drives said first film press to drop onto the film to press the film after the film has been released and dropped onto said film receiving table, said second drive drives said second film presses to lift both ends of the dropped film and then get out of the film to be above the film, said second drive drives said second film presses to then drop onto the film to press the film, and said first drive moves upwardly said first film press so as to have a clearance between the film and said first film press.

43. A film peeling apparatus according to claim 6, wherein said peel hand includes:
- a rotary member horizontally rotating about a central axis of rotation running in parallel with the one end portion of the film, said rotary member on which said pair of clamping pieces are arranged so as to face to the central axis of rotation.

44. A film peeling apparatus according to claim 43, wherein a stacking device is arranged in a film peeling direction with respect to said adsorbing device, said film peeling direction being a direction in which a film is peeled by said peel hand, said stacking device sequentially stacking and pressing films, each film being peeled by said peel hand and forwarded substantially horizontally.

45. A film peeling apparatus according to claim 44, wherein said stacking device includes:
- a horizontal film receiving table located below a substantially horizontal locus of movement of the film peeled by said peel hand so as to be vertically adjustable;
- a first film press extending horizontally as well as in a direction orthogonal to the peeled film moving direction above said film receiving table so as to be vertically movable;
- a pair of second film presses located parallel as well as horizontally with said first film press above said film receiving table so as to interpose said first film press therebetween while being distant from said first film press;
- a first drive vertically driving said first film press; and
- a second drive vertically driving said second film presses.

46. A film peeling apparatus according to claim 45, wherein said first drive and said second drive move said first film press and said second film presses, respectively, such that said first drive moves said first film press above said locus of movement of the film and said second drive moves said second film presses below said locus of movement of the film when the peeled film is being moved over said film receiving table by said peel hand, said first drive drives said first film press to drop onto the film to press the film after the film has been released and dropped onto said film receiving table, said second drive drives said second film presses to lift both ends of the dropped film and then get out of the film to be above the film, said second drive drives said second film presses to then drop onto the film to press the film, and said first drive moves upwardly said first film press so as to have a clearance between the film and said first film press.

47. A film peeling apparatus according to claim 43, wherein said central axis of rotation is arranged so as to pass adjacent to the one end of the board.

48. A film peeling apparatus according to claim 47, wherein a stacking device is arranged in a film peeling direction with respect to said adsorbing device, said film peeling direction being a direction in which a film is peeled by said peel hand, said stacking device sequentially stacking and pressing films, each film being peeled by said peel hand and forwarded substantially horizontally.

49. A film peeling apparatus according to claim 48, wherein said stacking device includes:
- a horizontal film receiving table located below a substantially horizontal locus of movement of the film peeled by said peel hand so as to be vertically adjustable;
- a first film press extending horizontally as well as in a direction orthogonal to the peeled film moving direction above said film receiving table so as to be vertically movable;
- a pair of second film presses located parallel as well as horizontally with said first film press above said film receiving table so as to interpose said first film press therebetween while being distant from said first film press;
- a first drive vertically driving said first film press; and
- a second drive vertically driving said second film presses.

50. A film peeling apparatus according to claim 49, wherein said first drive and said second drive move said first film press and said second film presses, respectively, such that said first drive moves said first film press above said locus of movement of the film and said second drive moves said second film presses below said locus of movement of the film when the peeled film is being moved over said film receiving table by said peel hand, said first drive drives said first film press to drop onto the film to press the film after the film has been released and dropped onto said film receiving table, said second drive drives said second film presses to lift both ends of the dropped film and then get out of the film to be above the film, said second drive drives said second film presses to then drop onto the film to press the film, and said first drive moves upwardly said first film press so as to have a clearance between the film and said first film press.

51. A film peeling apparatus according to claim 6, wherein a stacking device is arranged in a film peeling direction with respect to said adsorbing device, said film peeling direction being a direction in which a film is peeled by said peel hand, said stacking device sequentially stacking and pressing films, each film being peeled by said peel hand and forwarded substantially horizontally.

52. A film peeling apparatus according to claim 51, wherein said stacking device includes:

- a horizontal film receiving table located below a substantially horizontal locus of movement of the film peeled by said peel hand so as to be vertically adjustable;
- a first film press extending horizontally as well as in a direction orthogonal to the peeled film moving direction above said film receiving table so as to be vertically movable;
- a pair of second film presses located parallel as well as horizontally with said first film press above said film receiving table so as to interpose said first film press therebetween while being distant from said first film press;
- a first drive vertically driving said first film press; and
- a second drive vertically driving said second film presses.

53. A film peeling apparatus according to claim 52, wherein said first drive and said second drive move said first film press and said second film presses, respectively, such that said first drive moves said first film press above said locus of movement of the film and said second drive moves said second film presses below said locus of movement of the film when the peeled film is being moved over said film receiving table by said peel hand, said first drive drives said first film press to drop onto the film to press the film after the film has been released and dropped onto said film receiving table, said second drive drives said second film presses to lift both ends of the dropped film and then get out of the film to be above the film, said second drive drives said second film presses to then drop onto the film to press the film, and said first drive moves upwardly said first film press so as to have a clearance between the film and said first film press.

54. A film peeling apparatus according to any one of claims 6 to 53, wherein said film peeling apparatus further comprising a board feeding device for feeding the board with the overhanging end portion of the film as the head end or tail end thereof, wherein said adsorbing device includes a turn table being located below said feeding line of said feeding device, adsorbing the board, rotating the board by 90° while lifting the board from said feeding line, and wherein said peel hand forwarding device includes a guide and a peel hand drive, said guide being arranged so as to guide said peel hand in a direction orthogonal to said feeding line by passing over the board, said peel hand drive causing said peel hand to shuttle along said guide.

* * * * *